United States Patent
Kawano et al.

(10) Patent No.: US 6,756,609 B2
(45) Date of Patent: Jun. 29, 2004

(54) SEMICONDUCTOR LIGHT RECEIVING ELEMENT PROVIDED WITH ACCELERATION SPACER LAYERS BETWEEN PLURALITY OF LIGHT ABSORBING LAYERS AND METHOD FOR FABRICATING THE SAME

(75) Inventors: Kenji Kawano, Atsugi (JP); Hiroaki Yoshidaya, Atsugi (JP); Jun Hiraoka, Atsugi (JP); Yuichi Sasaki, Atsugi (JP)

(73) Assignee: Anritsu Corporation, Tokyo (JP)

( * ) Notice: Subject to any disclaimer, the term of this patent is extended or adjusted under 35 U.S.C. 154(b) by 0 days.

(21) Appl. No.: 10/312,470

(22) PCT Filed: Apr. 26, 2002

(86) PCT No.: PCT/JP02/04203
§ 371 (c)(1),
(2), (4) Date: Dec. 23, 2002

(87) PCT Pub. No.: WO02/091485
PCT Pub. Date: Nov. 14, 2002

(65) Prior Publication Data
US 2003/0151052 A1 Aug. 14, 2003

(30) Foreign Application Priority Data
May 2, 2001 (JP) .................................... 2001-135149

(51) Int. Cl.[7] .......................... H01L 33/00; H01S 5/00
(52) U.S. Cl. ........................ 257/79; 257/13; 257/102; 257/103; 372/45; 372/50; 372/96
(58) Field of Search .......................... 257/13, 79–103, 257/656, 918; 372/45, 50, 96

(56) References Cited

U.S. PATENT DOCUMENTS 5,459,747 A * 10/1995 Takiguchi et al. ............. 372/50
5,606,572 A * 2/1997 Swirhun et al. ............... 372/96

FOREIGN PATENT DOCUMENTS

| JP | 6-291351 A | 10/1994 |
|---|---|---|
| JP | 9-275224 A | 10/1997 |
| JP | 10-270741 A | 10/1998 |
| JP | 2000-68550 A | 3/2000 |
| JP | 2000-82837 A | 3/2000 |
| JP | 2000-216424 A | 8/2000 |
| JP | 2001-111096 A | 4/2001 |

OTHER PUBLICATIONS

H. Ito et al; High–Efficiency Unitraveling–Carrier Photodiode with an Integrated Total–Reflection Mirror; Journal of Lightwave Technology, vol. 18, No. 3, Mar. 2000; pp. 384–387.

N. Shimizu et al; InP–InGaAs UNI–Traveling–Carrier Photodiode with Improved 3–da bandwith of over 150 Ghz, IEEE Photonics Technology Letters, vol. 10, No. 3, Mar. 1998, pp. 412–414.

* cited by examiner

*Primary Examiner*—David Nelms
*Assistant Examiner*—Long Tran
(74) *Attorney, Agent, or Firm*—Frishauf, Holtz, Goodman & Chick, P.C.

(57) ABSTRACT

A semiconductor light receiving element has an n electrode, an n-type semiconductor doped layer or a non-doped layer provided above the n electrode, a semiconductor light absorbing layer provided above the n-type semiconductor doped layer or the non-doped layer, a p-type semiconductor doped layer provided above the semiconductor light absorbing layer, and a p electrode provided above the p-type semiconductor doped layer. The semiconductor light absorbing layer has at least two layer portions doped to p-type, and a spacer layer for acceleration which is formed from a semiconductor material sandwiched by the two layer portions and which makes electrons and positive holes generated by incident light being absorbed at the semiconductor light absorbing layer accelerate and run.

10 Claims, 5 Drawing Sheets

SEMICONDUCTOR LIGHT RECEIVING ELEMENT PROVIDED WITH ACCELERATION SPACER LAYERS BETWEEN PLURALITY OF LIGHT ABSORBING LAYERS AND METHOD FOR FABRICATING THE SAME

This application is a U.S. National Phase Application under 35 USC 371 of International Application PCT/JP02/04203 filed Apr. 26, 2002.

TECHNICAL FIELD

The present invention relates to a semiconductor light receiving element and a method of manufacturing the same, and in particular, to a semiconductor light receiving element having high-speed and highly efficient light-receiving characteristics and a method for manufacturing the same.

BACKGROUND ART

Conventionally, a semiconductor light receiving element formed from a semiconductor element converting light signals into electric signals has been known.

FIG. 7 is a perspective view showing a structure of an end face refracting type semiconductor light receiving element as such a general semiconductor light receiving element.

FIG. 8 is a cross-sectional view showing a structure of the end face refracting type semiconductor light receiving element as such a general semiconductor light receiving element.

Namely, as shown in FIG. 7 and FIG. 8, this end face refracting type semiconductor light receiving element is structured such that a running layer 2 formed from i-InP is formed on a substrate 1 formed from n$^+$-InP.

On this running layer 2, a light absorbing layer 3 formed from p-InGaAs, a block layer 4 formed from p$^+$-InGaAsP, and a contact layer 5 formed from p$^+$-InGaAs are formed.

A p electrode 6 is mounted on the top surface of the contact layer 5.

Further, an n electrode 7 is mounted on the bottom surface of the above-described substrate 1.

Moreover, polyimide 8 is formed at one portion of the side surfaces of the running layer 2, the light absorbing layer 3, the block layer 4, and the contact layer 5, and at the bottom surface of the p electrode 6, in order to reduce the capacitance.

As shown in FIG. 8, in the end face refracting type semiconductor light receiving element, light is made incident on an inclined end face 1a of the substrate 1.

This incident light is refracted at the end face 1a, and thereafter, is made incident on the light absorbing layer 3 via the running layer 2.

Then, the incident light is absorbed at the light absorbing layer 3, and thereafter, is photoelectrically converted into electrons and positive holes.

Here, a predetermined reverse bias voltage is applied between the p electrode 6 and the n electrode 7.

FIG. 9 is a diagram showing a band-diagram of the end face refracting type semiconductor light receiving element at the time of applying the reverse bias voltage.

Next, by using this band diagram, the principles of operation of the end face refracting type semiconductor light receiving element will be considered in detail.

As described above, the incident light is absorbed at the light absorbing layer 3, and thereafter, the incident light is photoelectrically converted into electrons and positive holes. As a result, electrons 9 are generated at a conduction band, and positive holes 10 are generated at a valence band.

Generally, when the light absorbing layer 3 is not doped, because the mass of the positive holes 10 at the valence band is large, it is difficult for the positive holes 10 to move if a large bias voltage is not applied. Therefore, it is difficult for the positive holes 10 to be taken as electric current.

As a result, in the semiconductor light receiving element, a large bias voltage must be applied, and it is generally known that it is easy for heat destruction, which is due to the Joule heat provided by the product of the applied voltage and the flowing electric current being large, to arise.

In order to overcome such a problem, in the semiconductor light receiving element, a structure such as the following in which the light absorbing layer 3 is doped to p-type has been reported.

Namely, although an internal electric field does not exist in the light absorbing layer 3, because the positive holes 10 are the majority carrier, the movement thereof is fast regardless of the fact that the mass thereof is large. The positive holes 10 move to the contact layer 5 formed from p$^+$-InGaAs, and thereafter, are output to the exterior via the p electrode 6.

On the other hand, the electrons 9, which are the minority carrier at the conduction band, move to the running layer 2 by diffusing in the light absorbing layer 3 in which no internal electric field exists.

Because an internal electric field exists in the running layer 2, the electrons 9 which have reached this region reach the substrate 1 formed from n$^+$-InP at a high speed by drifting due to the internal electric field, and are taken out to the exterior via the n electrode 7.

Here, the block layer 4 formed from p$^+$-InGaAsP blocks the electrons 9 such that the electrons 9 generated at the light absorbing layer 3 do not flow toward the contact layer 5 formed from p$^+$-InGaAs.

In this way, because the carriers running at the running layer 2 which is a non-doped layer are only the electrons 9, the semiconductor light receiving element in which the light absorbing layer 3 is doped to p-type is called a unitraveling carrier photodiode (hereinafter, called UTC-PD) (refer to Jpn. Pat. Appln. KOKAI Publication No. 9-275224).

However, in the above-described UTC-PD, there are still problems to be solved as follows.

Namely, because the incident light is absorbed at the light absorbing layer 3, there is the need to make the thickness of the light absorbing layer 3 thick in order to efficiently convert the light incident on the unitraveling carrier type semiconductor photodiode from the exterior into the electrons 9 and the positive holes 10.

However, as described above, in the UTC-PD, an internal electric field does not exist in the light absorbing layer 3 doped to p-type, and the electrons 9 which are the minority carrier move only by diffusion in the light absorbing layer 3.

In this case, although the mass of the electrons 9 is light, the diffusion length of the electrons 9 generally is not long.

Therefore, in such a unitraveling carrier type semiconductor photodiode, if the light absorbing layer 3 is made thicker than the diffusion length of the electrons 9 in order to increase the efficiency of the light incident from the exterior being converted into electric current, the electrons 9 cannot reach the running layer 2, and the desired high-speed response cannot be obtained.

Moreover, in such a unitraveling carrier type semiconductor photodiode, light cannot be newly absorbed because the electrons 9 are not able to move and accumulate at the conduction band. As a result, the efficiency of the light incident from the exterior being converted into the electrons 9 and the positive holes 10 also deteriorates.

Namely, in the UTC-PD, due to the limit of the thickness of the light absorbing layer 3 doped to p-type, if the thickness is made thin in order to obtain a high-speed response, the efficiency of the light being converted into the electrons 9 and the positive holes 10 deteriorates. Conversely, if the thickness is made thick in order to obtain a high conversion efficiency, the high-speed response cannot be obtained. Therefore, there is the problem that it is difficult to realize a semiconductor light receiving element having both of two characteristics which are high speed and high efficiency.

Incidentally, in order to realize a response speed of 50 GHz or more with excellent reproducibility, the limit of the thickness of the light absorbing layer 3 is about 0.3 μm from the standpoint of the diffusion length of the electrons 9.

Namely, this is because the problem arises that, if the thickness of the light absorbing layer 3 is made to be thick to, for example, about 0.6 μm in order to increase the efficiency of converting the incident light into the electrons 9 and the positive holes 10, the operation frequency markedly deteriorates since the thickness becomes much greater than about 0.3 μm which is the diffusion length of the electrons 9 described above.

Moreover, in the UTC-PD, also when the thickness of the light absorbing layer 3 is thinner than the diffusion length of the electrons, if the incident light amount of the light is low, the repulsion arising among the generated electrons is small. Therefore, the electrons cannot utilize the repulsion.

As a result, it has been understood that the problem of the frequency response characteristic deteriorating arises in UTC-PDs.

Namely, this is because, when the incident light amount of the light is low, there is hardly repulsion among the electrons because the number of generated electrons is small, and the electrons generated in the light absorbing layer 3 move purely by diffusion.

As a result, in the UTC-PD, when the incident light amount of the light is small, the frequency response characteristic deteriorates.

Namely, in the UTC-PD, because a high-speed response is possible only in cases of a large incident light amount, there is the limitation on use that an applicable system must be able to supply a large incident light amount to that UTC-PD.

In a general optical fiber communication system, due to absorption in an optical fiber, insertion loss of an optical device for use in a communication system or the like, the strength of the light entering light receiving element is weak.

Accordingly, in order to use the UTC-PD, there are problems from the standpoint of the cost of the communication system as well, such as there is the need to use a fiber amplifier before leading light to the photodiode, and the like.

DISCLOSURE OF INVENTION

The present invention has been achieved in consideration of circumstances such as those described above, and an object of the present invention is to provide a semiconductor light receiving element in which by interposing a spacer layer for acceleration between a plurality of light absorbing layers, high-speed movement of electrons at a light absorbing layer is possible, and a thick light absorbing layer on the whole can be used, and which is high-speed and highly efficient regardless of the magnitude of the incident light amount, and to provide a method of manufacturing the same.

In order to achieve the above object, according to an aspect of the present invention, there is provided a semiconductor light receiving element comprising:

an n electrode (7);

an n-type semiconductor doped layer or a non-doped layer (2) provided above the n electrode;

a semiconductor light absorbing layer provided above the n-type semiconductor doped layer or the non-doped layer;

a p-type semiconductor doped layer (4, 5) provided above the semiconductor light absorbing layer; and a p electrode (6) provided above the p-type semiconductor doped layer, wherein the semiconductor light absorbing layer has at least two layer portions (11, 13) doped to p-type, and a spacer layer (12) for acceleration which is formed from a semiconductor material sandwiched by the two layer portions and which makes electrons and positive holes generated by incident light being absorbed at the semiconductor light absorbing layer accelerate and run.

According to a second aspect of the present invention, there is provided a semiconductor light receiving element according to the first aspect, wherein the spacer layer is formed from a non-doped type semiconductor material.

According to a third aspect of the present invention, there is provided a semiconductor light receiving element according to the first aspect, wherein the spacer layer is formed from a semiconductor material doped to n-type.

According to a fourth aspect of the present invention, there is provided a semiconductor light receiving element according to the first aspect, wherein the spacer layer is formed from a semiconductor material weakly doped to p-type to an extent that an internal electric field exists.

According to a fifth aspect of the present invention, there is provided a semiconductor light receiving element according to the first aspect, wherein the spacer layer is formed from a multi-quantum well structure in which a plurality of semiconductor materials are combined.

According to a sixth aspect of the present invention, there is provided a semiconductor light receiving element according to the first aspect, wherein the semiconductor light absorbing layer is set such that band-gap wavelengths of the respective two layer portions doped to p-type become longer from the p electrode side toward the n electrode side.

According to a seventh aspect of the present invention, there is provided a semiconductor light receiving element according to the first aspect, wherein the semiconductor light absorbing layer is set such that a band-gap wavelength of at least one of the two layer portions doped to p-type becomes longer in an inclined manner from the p electrode side toward the n electrode side.

According to an eighth aspect of the present invention, there is provided a semiconductor light receiving element according to the first aspect, wherein the semiconductor light absorbing layer is set such that a dopant concentrations of at least one of the two layer portions doped to p-type becomes lower from the p electrode side toward the n electrode side.

According to a ninth aspect of the present invention, there is provided a semiconductor light receiving element according to the fourth aspect, wherein the semiconductor light absorbing layer is set such that a dopant concentration of at least one of the two layer portions doped to p-type and a dopant concentration of the spacer layer formed from a semiconductor material weakly doped to p-type to an extent that the internal electric field exists become lower from the p electrode side toward the n electrode side.

According to a tenth aspect of the present invention, there is provided a semiconductor light receiving element according to the first aspect, wherein the semiconductor light absorbing layer is weakly doped such that a dopant concentration of at least one of the two layer portions doped to p-type makes an internal electric field exist.

In order to achieve the above object, according to an eleventh aspect of the present invention, there is provided a method of manufacturing a semiconductor light receiving element comprising:

forming an n electrode (7);

forming an n-type semiconductor doped layer (2) or a non-doped layer above the n electrode;

forming a semiconductor light absorbing layer above the n-type semiconductor doped layer or the non-doped layer;

forming a p-type semiconductor doped layer (4, 5) above the semiconductor light absorbing layer; and forming a p electrode (6) above the p-type semiconductor doped layer, wherein the formation of the semiconductor light absorbing layer is performed by forming at least two layer portions (11, 13) doped to p-type, and forming a spacer layer (12) for acceleration which is formed from a semiconductor material sandwiched by the two layer portions and which makes electrons and positive holes generated by incident light being absorbed at the semiconductor light absorbing layer accelerate and run.

According to a twelfth aspect of the present invention, there is provided a method of manufacturing a semiconductor light receiving element according to the eleventh aspect, wherein the spacer layer is formed a non-doped type semiconductor material.

According to a thirteenth aspect of the present invention, there is provided a method of manufacturing a semiconductor light receiving element according to the eleventh aspect, wherein the spacer layer is formed from a semiconductor material doped to n-type.

According to a fourteenth aspect of the present invention, there is provided a method of manufacturing a semiconductor light receiving element according to the eleventh aspect, wherein the spacer layer is formed from a semiconductor material weakly doped to p-type to an extent that an internal electric field exists.

According to a fifteenth aspect of the present invention, there is provided a method of manufacturing a semiconductor light receiving element according to the eleventh aspect, wherein the spacer layer is formed from a multi-quantum well structure in which a plurality of semiconductor materials are combined.

According to a sixteenth aspect of the present invention, there is provided a method of manufacturing a semiconductor light receiving element according to the eleventh aspect, wherein the semiconductor light absorbing layer is formed such that band-gap wavelengths of the respective two layer portions doped to p-type become longer from the p electrode side toward the n electrode side.

According to a seventeenth aspect of the present invention, there is provided a method of manufacturing a semiconductor light receiving element according to the eleventh aspect, wherein the semiconductor light absorbing layer is formed such that a band-gap wavelength of at least one of the two layer portions doped to p-type becomes longer in an inclined manner from the p electrode side toward the n electrode side.

According to an eighteenth aspect of the present invention, there is provided a method of manufacturing a semiconductor light receiving element according to the eleventh aspect, wherein the semiconductor light absorbing layer is formed such that a dopant concentration of at least one of the two layer portions doped to p-type becomes lower from the p electrode side toward the n electrode side.

According to a nineteenth aspect of the present invention, there is provided a method of manufacturing a semiconductor light receiving element according to the fourteenth aspect, wherein the semiconductor light absorbing layer is formed such that a dopant concentration of at least one of the two layer portions doped to p-type and a dopant concentration of the spacer layer formed from a semiconductor material weakly doped to p-type to the extent that the internal electric field exists, become lower from the p electrode side toward the n electrode side.

According to a twentieth aspect of the present invention, there is provided a method of manufacturing a semiconductor light receiving element according to the eleventh aspect, wherein the semiconductor light absorbing layer is weakly doped such that a dopant concentration of at least one of the two layer portions doped to p-type makes an internal electric field exist.

BEST MODES FOR CARRYING OUT OF THE INVENTION

Hereinafter, respective embodiments of the present invention will be described with reference to the figures.

(First Embodiment)

Figure 1:
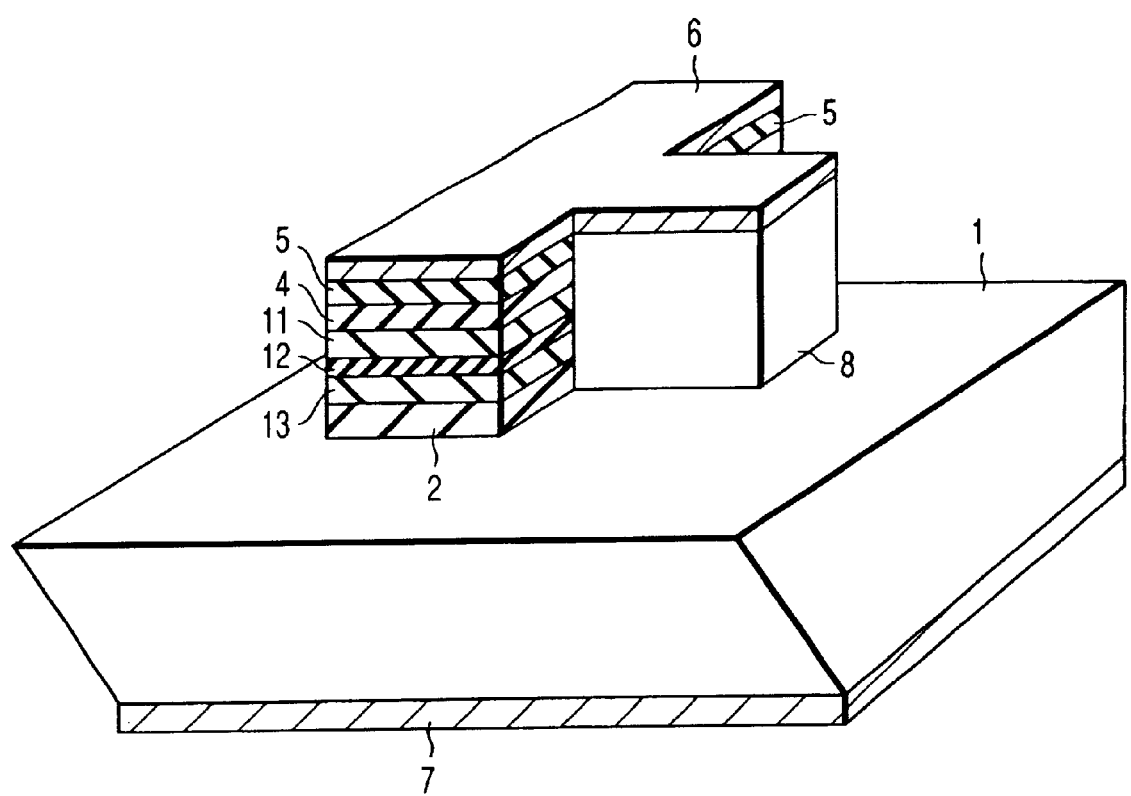
FIG. 1 is a perspective view showing a schematic structure of a semiconductor light receiving element according to a first embodiment of the present invention.

FIG. 1 is a perspective view showing a schematic structure of a semiconductor light receiving element according to a first embodiment of the present invention.

Figure 7:
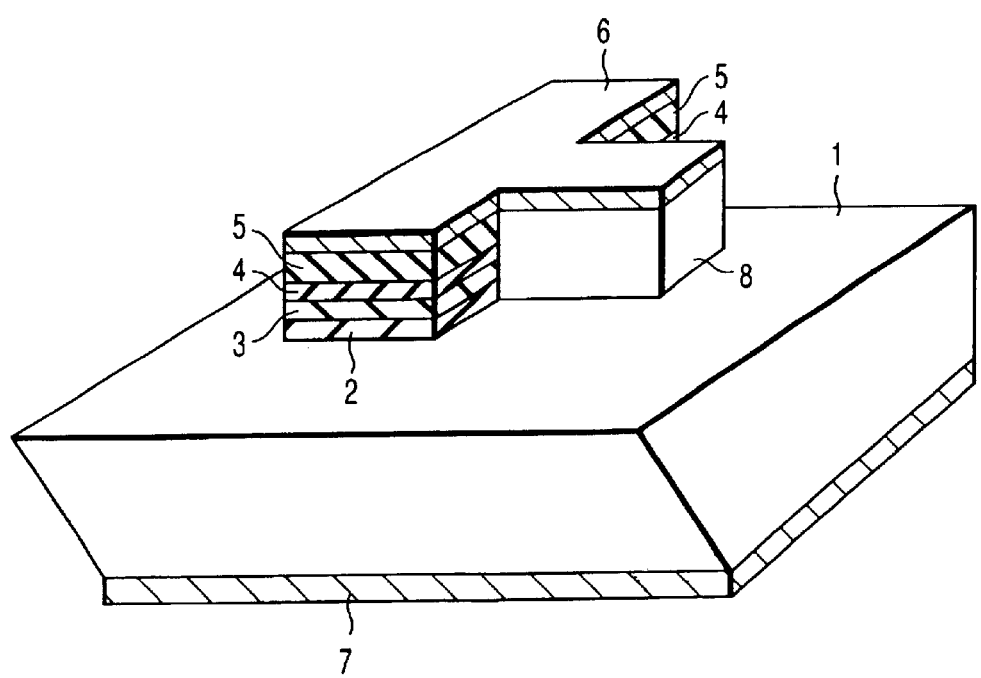
FIG. 7 is a perspective view showing a schematic structure of a conventional semiconductor light receiving element.

In FIG. 1, portions which are the same as those of the conventional semiconductor light receiving element shown in FIG. 7 are denoted by the same reference numerals, and details of duplicate portions will be omitted.

Namely, as shown in FIG. 1, a running layer 2 formed from non-doped type i-InP or n-type n-InP is formed on the substrate 1 formed from $n^+$-InP and serving as an n-type semiconductor doped layer.

A second light absorbing layer 13 formed from p-InGaAs, a spacer layer 12 formed from, for example, non-doped type i-InGaAs, a first light absorbing layer 11 formed from p-InGaAs, a block layer 4, formed from $p^+$-InGaAsP and serving as a p-type semiconductor doped layer, and a contact layer 5 formed from $p^+$-InGaAs are formed on the running layer 2.

The p electrode 6 is mounted on the top surface of the contact layer 5.

An n electrode 7 is mounted on the bottom surface of the above-described substrate 1.

Moreover, a polyimide 8 is formed in order to reduce the capacitance, at a portion of the side surfaces of the running layer 2, the second light absorbing layer 13, the spacer layer 12, the first light absorbing layer 11, the block layer 4, and the contact layer 5, and at the bottom surface of the p electrode 6.

Namely, the points that differ the most from the conventional semiconductor light receiving element shown in FIG. 7 are that the semiconductor light receiving element of the first embodiment uses the plurality of light absorbing layers 11, 13 formed from the same semiconductor material of p-InGaAs, and the spacer layer 12 formed from, for example, non-doped type i-InGaAs is interposed between the plurality of light absorbing layers 11, 13.

Note that, in the semiconductor light receiving element of the first embodiment, the number of the light absorbing layers 11, 13 is two layers, but may be three or more layers as long as the spacer layer 12 is sandwiched therebetween.

Note that it is known that an i-type (non-doped type) semiconductor such as, for example, i-InGaAs or the like, which forms the spacer layer 12, generally has a slight n-type characteristic.

Accordingly, the spacer layer 12 is not limited to an i-type (non-doped type) semiconductor such as i-InGaAs or the like, and may be a layer formed from a semiconductor material which allows electrons and positive holes to accelerate and run.

For example, the above-described spacer layer 12 may be a layer formed from a semiconductor material which is doped to n-type, or may be a layer formed from a semiconductor material which is weakly (for example, $1 \times 10^{17}$ $^{cm-3}$) doped to p-type to an extent that an internal electric field exists.

The semiconductor material of the spacer layer 12 may use a multi-quantum well structure in which semiconductor materials are combined.

Further, the spacer layer 12 itself may be made to function as a light absorbing layer for absorbing light.

Here, a reverse bias voltage of a predetermined value is applied between the p electrode 6 and the n electrode 7.

Figure 2:
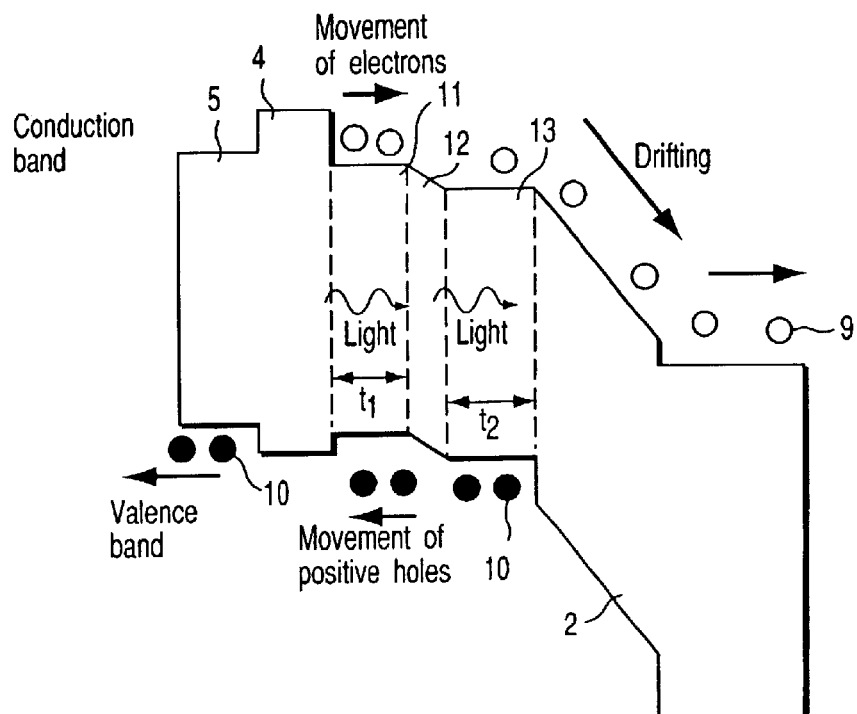
FIG. 2 is a diagram showing a band-diagram at the time of applying a reverse bias voltage to the semiconductor light receiving element according to the first embodiment of the present invention.

FIG. 2 is a diagram showing a band-diagram of the semiconductor light receiving element at the time of applying the reverse bias voltage.

Next, features of the semiconductor light receiving element according to the first embodiment of the present invention, which is structured as described above, will be described by using the band-diagram shown in FIG. 2.

Figure 8:
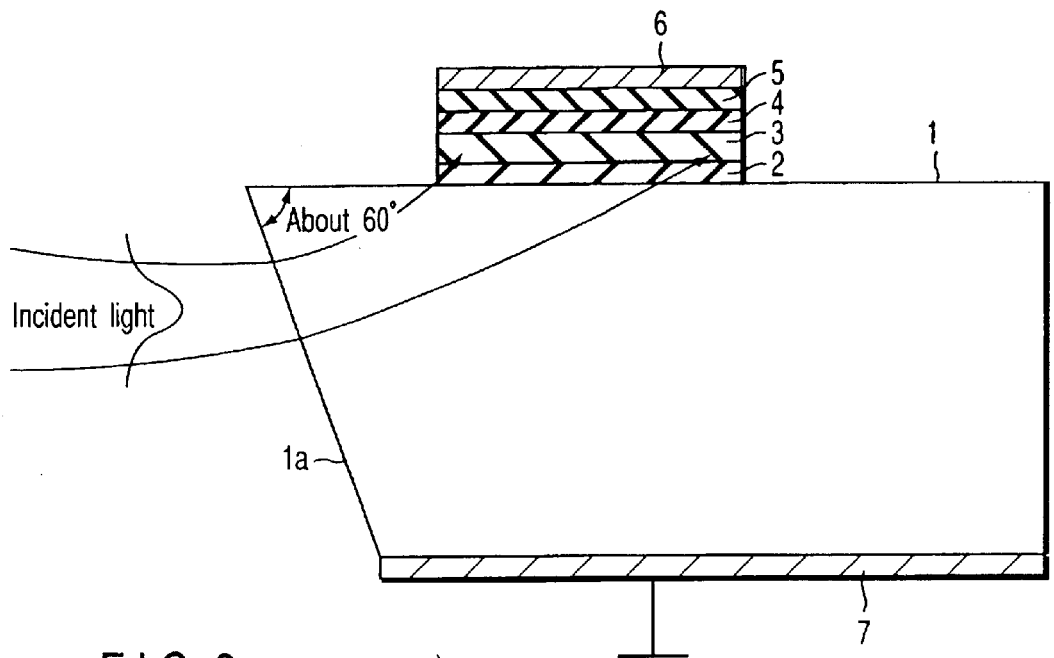
FIG. 8 is a cross-sectional view showing a schematic structure of the conventional semiconductor light receiving element.
Figure 9:
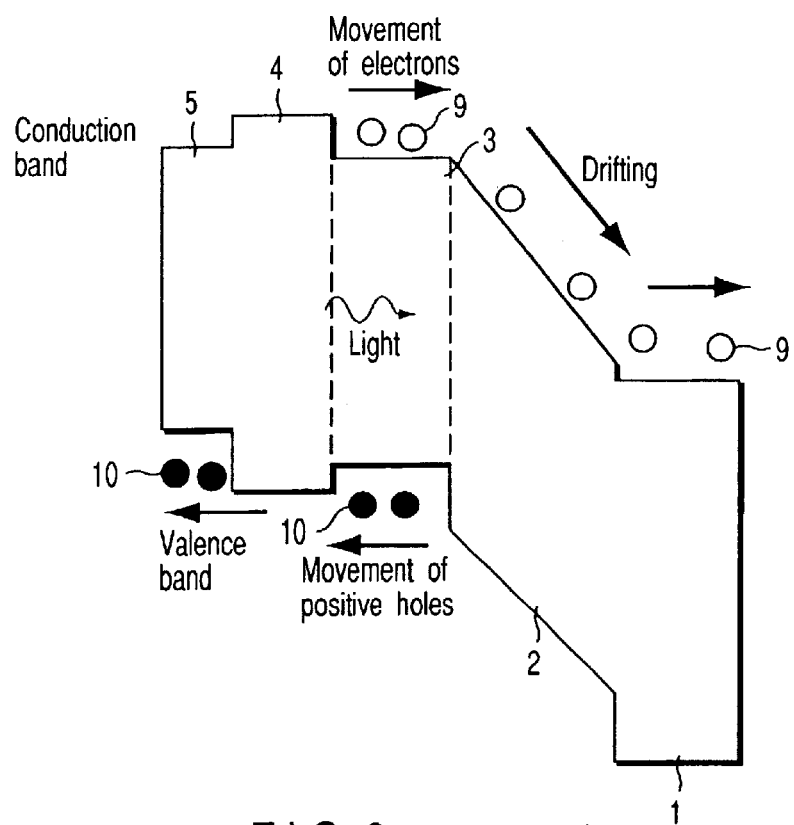
FIG. 9 is a diagram showing a band-diagram at the time of applying a reverse bias voltage to the conventional semiconductor light receiving element.

As described above, in the conventional semiconductor light receiving element shown in FIG. 7 through FIG. 9, there is the problem that, if the thickness of the light absorbing layer 3 is made thicker than the diffusion length of the electrons in order to highly-efficiently convert the incident light into electrons 9 and positive holes 10, the electrons 9 generated as a result of the light being absorbed into the light absorbing layer 3 cannot reach the running layer 2, and high-speed operation is impossible.

On the other hand, in the semiconductor light receiving element of the first embodiment according to the present invention, because an electric field is applied to the spacer layer 12 interposed between the first and second light absorbing layers 11, 13, the electrons 9 and the positive holes 10 generated by the incident light being absorbed at the light absorbing layers are accelerated at the spacer layer 12.

Accordingly, also when the light absorbing layer is thicker than the diffusion length of the electrons 9, the light absorbing layer is divided into plural layers formed from the first and second light absorbing layers 11, 13, and the electrons 9 are accelerated at the spacer layer 12 interposed between the two, and thus, the electrons 9 can reach the running layer 2.

Further, in the semiconductor light receiving element of the first embodiment according to the present invention, the thickness of each light absorbing layer doped to p-type is thin and is about ½ that of the prior art. Therefore, even if the incident light amount of the light is small, the electrons 9 can respond sufficiently quickly in the respective light absorbing layers.

That is, in this case, even when the electrons 9 must move purely by only diffusion because the number of electrons generated in the light absorbing layer is few and repulsion thereamong cannot be expected, since the thickness of each light absorbing layer doped to p-type is thin, the electrons 9 can respond sufficiently quickly.

On the other hand, because the thickness t of the light absorbing layer is a total thickness $(t_1+t_2)$ of respective thicknesses $t_1, t_2$ of the plurality of light absorbing layers 11, 13, the efficiency of converting the incident light into the electrons 9 and the positive holes 10 can be markedly increased.

Accordingly, in accordance with the first embodiment of the present invention, a high-speed and highly efficient semiconductor light receiving element can be realized.

Note that, as in the present embodiment described above, when light is also absorbed at the spacer layer 12, the thickness thereof is added to the thickness t of the light absorbing layer.

Moreover, although both of the electrons 9 and the positive holes 10 run at the spacer layer 12, the thickness of the spacer layer 12 is thin and is about 0.3 μm or less, and thereby it suffices that a value of the reverse bias voltage to be applied is small.

Next, the effect that the spacer layer 12 inserted between the plurality of light absorbing layers has on the capacitance of a semiconductor light receiving element will be verified.

When the spacer layer 12 is one layer, consideration of the capacitance can be simplified. Therefore, consideration of the effects that the spacer layer 12 has on the capacitance of the entire semiconductor light receiving element will be carried out by using the semiconductor light receiving element of the first embodiment shown in FIG. 1 and FIG. 2.

It is assumed that the capacitance caused at the spacer layer 12 is $C_S$, and the capacitance of the running layer 2 is $C_M$.

Thus, the capacitance $C_G$ of the entire semiconductor light receiving element can be determined by the equation (1) by synthesizing these two capacitances $C_S$ and $C_M$.

$$1/C_G = (1/C_S) + (1/C_M) \quad (1)$$

Here, for example, when the thickness of the spacer layer 12 is from several nm to several tens of nm, the capacitance $C_S$ thereof is sufficiently large as compared with the capacitance $C_M$ of the running layer 2 (for example, about 0.4 μm).

Accordingly, in the equation (1), the first term at the right side can be ignored as compared with the second term at the right side. As a result, the capacitance $C_G$ of the entire semiconductor light receiving element is substantially equal to the capacitance $C_M$ caused at the running layer 2.

In accordance therewith, the effect that the spacer layer 12 has on the capacitance $C_G$ as of the entire semiconductor light receiving element can almost be ignored.

Conversely, when the capacitance $C_S$ of the spacer layer 12 is small and is about the same as the capacitance $C_M$ of the running layer 2, the capacitance $C_G$ of the entire semiconductor light receiving element becomes about the half of the capacitance $C_S$ of the spacer layer 12.

In the above description, for simplification, the effect on the capacitance $C_G$ of the entire semiconductor light receiving element is considered for the embodiment having only one layer of the spacer layer 12.

However, the fact that the spacer layer 12 does not make the capacitance $C_G$ of the entire semiconductor light receiving element large and does not adversely affect the high-speed response is realized also by light receiving elements, in which a plurality of spacer layers 12 and a plurality of light absorbing layers exist.

(Second Embodiment)

Figure 3:
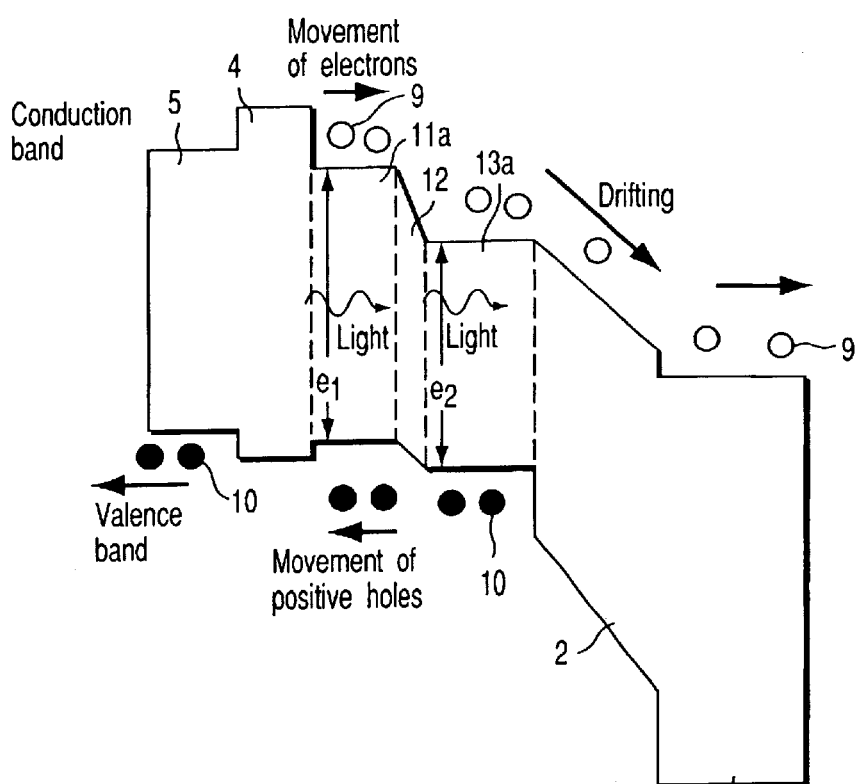
FIG. 3 is a diagram showing a band-diagram at the time of applying a reverse bias voltage to a semiconductor light receiving element according to a second embodiment of the present invention.

FIG. 3 is a diagram showing a band-diagram of a semiconductor portion, at the time of applying a reverse bias voltage, of a semiconductor light receiving element according to a second embodiment of the present invention.

In FIG. 3, portions which are the same as the band-diagram of the semiconductor light receiving element of the first embodiment shown in FIG. 2 are denoted by the same reference numerals.

Note that a perspective view showing the structure of the entire semiconductor light receiving element according to the second embodiment of the present invention is substantially the same as that of the semiconductor light receiving element of the first embodiment shown in FIG. 1.

Accordingly, here, mainly, only portions which are different than the semiconductor light receiving element of the first embodiment will be described.

As shown in FIG. 3, in the semiconductor light receiving element of the second embodiment, a semiconductor material whose band-gap wavelength is longer than that of a first light absorbing layer 11a is used as a second light absorbing layer 13a.

In other words, as shown in FIG. 3, a band-gap energy $e_2$ of the second light absorbing layer 13a is set to be smaller than a band-gap energy $e_1$ of the first light absorbing layer 11a ($e_2 < e_1$).

For example, when light having a wavelength of 1.55 μm is absorbed, a semiconductor material whose band-gap wavelength is longer than that of the first light absorbing layer 11a may be used as the second light absorbing layer 13a.

For example, if p-InGaAsP or p-InGaAlAs having band-gap wavelengths of 1.58 μm and 1.62 μm, respectively, are used as the semiconductor materials of the first light absorbing layer 11a and the second light absorbing layer 13a, the semiconductor light receiving element of the present embodiment can be realized.

Moreover, p-InGaAsP or p-InGaAlAs may be used as the first light absorbing layer 11a, and p-InGaAs having a longer band-gap wavelength may be used as the second light absorbing layer 13a.

Needless to say, the band-gap wavelengths are not limited to these values.

Further, when three or more light absorbing layers are used, p-InGaAsP or p-InGaAlAs is used such that the band-gap wavelengths of the respective light absorbing layers become longer in stages from the p electrode 6 side toward the n electrode 7 side, and p-InGaAs may be used as the layer which is closest to the n electrode 7.

In this way, in the semiconductor light receiving element of the second embodiment of the present invention, because the drifting effect in the spacer portion 12 is greater and the electrons 9 are accelerated more, as compared with the semiconductor light receiving element of the first embodiment described above, an even higher speed response is possible.

(Third Embodiment)

Figure 4:
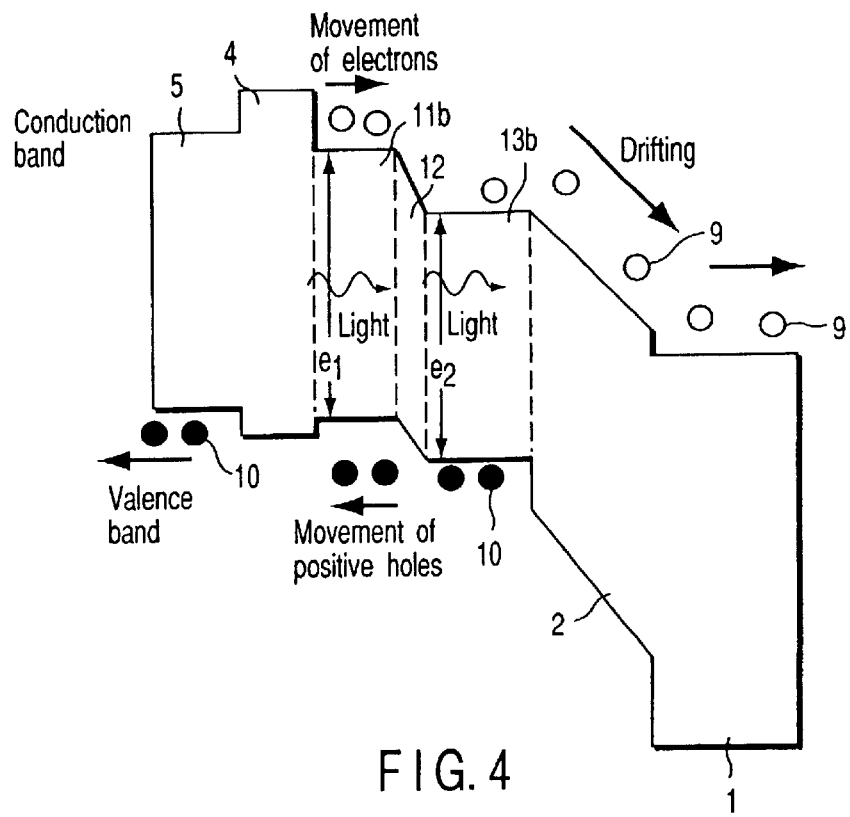
FIG. 4 is a diagram showing a band-diagram at the time of applying a reverse bias voltage to a semiconductor light receiving element according to a third embodiment of the present invention.

FIG. 4 is a diagram showing a band-diagram of a semiconductor portion, at the time of applying a reverse bias voltage, of a semiconductor light receiving element according to a third embodiment of the present invention.

In FIG. 4, portions which are the same as the band-diagram of the semiconductor light receiving element of the first embodiment shown in FIG. 2 are denoted by the same reference numerals.

Note that a perspective view showing the structure of the entire semiconductor light receiving element according to the third embodiment of the present invention is substantially the same as that of the semiconductor light receiving element of the first embodiment shown in FIG. 1.

Accordingly, here, mainly, only portions which are different than the semiconductor light receiving element of the first embodiment will be described.

In the semiconductor light receiving element of the third embodiment, the band-gap wavelength of a first light absorbing layer 11b and the band-gap wavelength of a second light absorbing layer 13b are equal to one another (band-gap energies; $e_1 = e_2$). However, the p-type dopant concentrations thereof are made to be different.

For example, if the p-type dopant concentration of the first light absorbing layer 11b is $1 \times 10^{18}$ cm$^{-3}$, the p-type dopant concentration of the second light absorbing layer 13b is set to be smaller, such as $5 \times 10^{17}$ cm$^{-3}$, than the p-type dopant concentration of the first light absorbing layer 11b.

It goes without saying that the p-type dopant concentrations are not limited to these values.

In this way, because the p-type dopant concentration of the second light absorbing layer 13b at the n electrode 7 side is set to be smaller than the p-type dopant concentration of the first light absorbing layer 11b at the p electrode 6 side, the effect of improving the drifting at the spacer layer 12 increases.

Therefore, in the semiconductor light receiving element of the third embodiment of the present invention, because the electrons 9 are accelerated more in the light absorbing layer, compared with the semiconductor light receiving element of the first embodiment shown in FIG. 2, an even higher speed response is possible.

Note that, when three or more light absorbing layers are used, it suffices that the p-dopant concentrations of the respective light absorbing layers are made to be smaller in order from the p electrode 6 side toward the n electrode 7 side.

Needless to say, the band-gap wavelengths of the plurality of light absorbing layers may be different.

(Fourth Embodiment)

Figure 5:
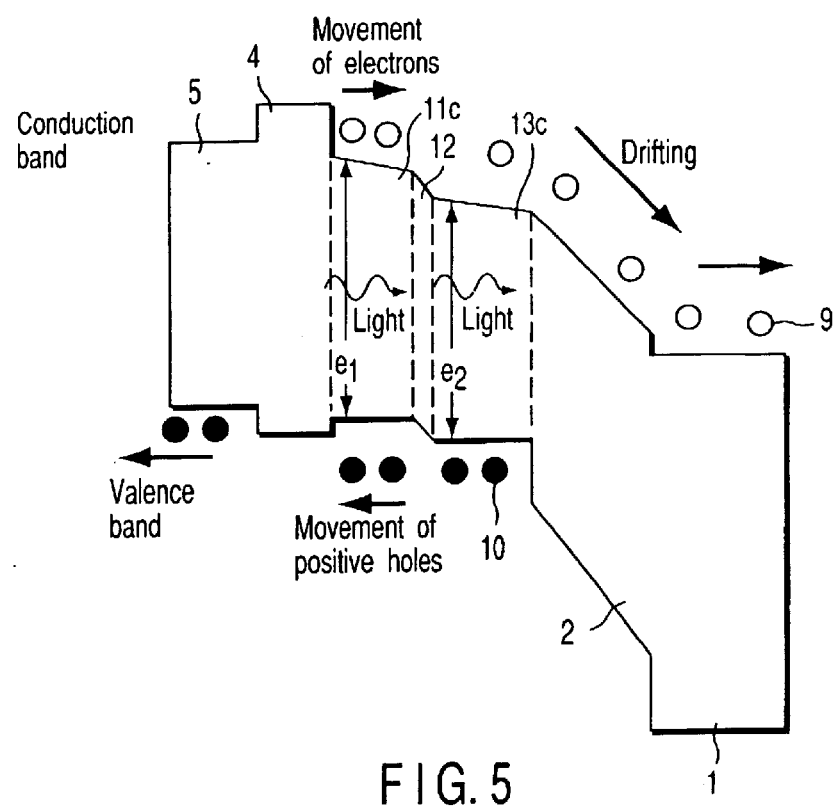
FIG. 5 is a diagram showing a band-diagram at the time of applying a reverse bias voltage to a semiconductor light receiving element according to a fourth embodiment of the present invention.

FIG. 5 is a diagram showing a band-diagram of a semiconductor portion, at the time of applying a reverse bias voltage, of a semiconductor light receiving element according to a fourth embodiment of the present invention.

In FIG. 5, portions which are the same as the band-diagram of the semiconductor light receiving element of the first embodiment shown in FIG. 2 are denoted by the same reference numerals.

Note that a perspective view showing the structure of the entire semiconductor light receiving element according to the fourth embodiment of the present invention is substantially the same as that of the semiconductor light receiving element of the first embodiment shown in FIG. 1.

Accordingly, here, mainly, only portions which are different than the semiconductor light receiving element of the first embodiment will be described.

In the semiconductor light receiving element of the fourth embodiment, the band-gap wavelength of a first light absorbing layer 11c and the band-gap wavelength of a second light absorbing layer 13c are respectively set so as to become gradually longer, namely, in an inclining manner, from the p electrode 6 side toward the n electrode 7 side.

In other words, as shown in FIG. 5, the band-gap energy $e_1$ of the first light absorbing layer 11c and the band-gap energy $e_2$ of the second light absorbing layer 13c are respectively set in an inclining manner so as to gradually become smaller from the p electrode 6 side toward the n electrode 7 side.

In this way, by inclining the band-gap wavelengths (band-gap energies) in the respective light absorbing layers 11c, 13c, the electrons 9 can be accelerated in the respective light absorbing layers 11c, 13c, as well.

Accordingly, in the semiconductor light receiving element of the fourth embodiment of the present invention, as compared with the semiconductor light receiving element of the second embodiment shown in FIG. 3, in which the band-gap wavelengths are constant in the respective light absorbing layers 11a, 13a, an even higher speed response is possible.

Moreover, in the semiconductor light receiving element of the fourth embodiment of the present invention as well, the p-type dopant concentrations may be set to become smaller from the p electrode 6 side toward the n electrode 7 side.

(Fifth Embodiment)

Figure 6:
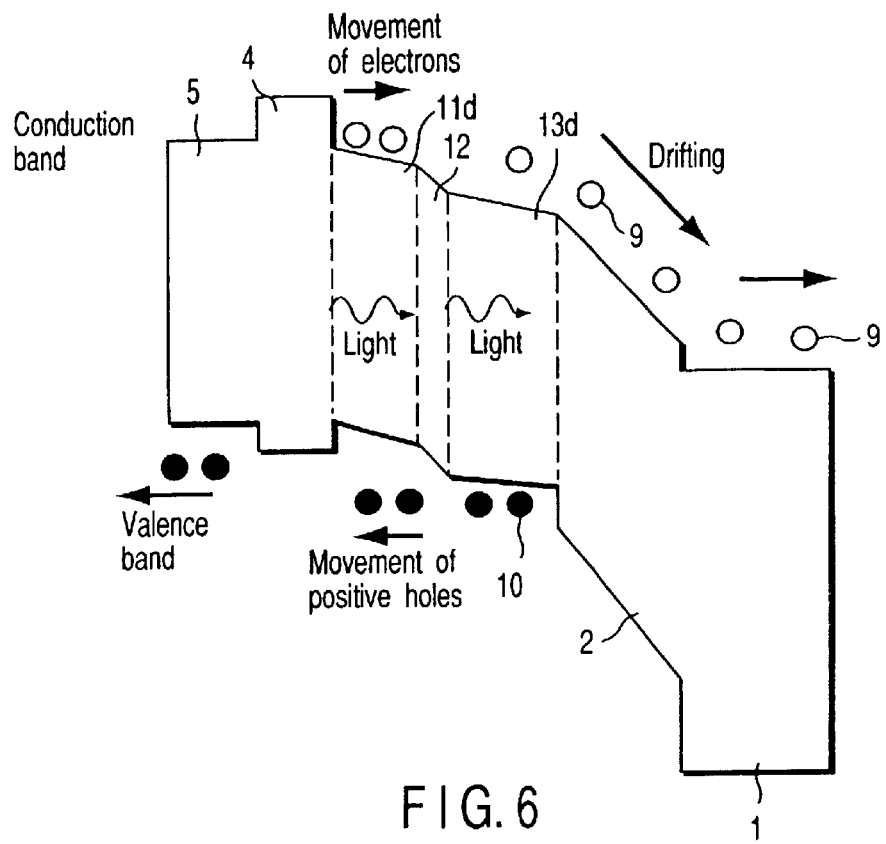
FIG. 6 is a diagram showing a band-diagram at the time of applying a reverse bias voltage to a semiconductor light receiving element according to a fifth embodiment of the present invention.

FIG. 6 is a diagram showing a band-diagram of a semiconductor portion, at the time of applying a reverse bias voltage of a semiconductor light receiving element according to a fifth embodiment of the present invention.

In FIG. 6, portions which are the same as the band-diagram of the semiconductor light receiving element of the first embodiment shown in FIG. 2 are denoted by the same reference numerals.

Note that a perspective view showing the structure of the entire semiconductor light receiving element according to the fifth embodiment of the present invention is substantially the same as that of the semiconductor light receiving element of the first embodiment shown in FIG. 1.

Accordingly, here, mainly, only portions which are different than the semiconductor light receiving element of the first embodiment will be described.

In the semiconductor light receiving element of the fifth embodiment, in a first light absorbing layer 11d and a second light absorbing layer 13d, the p-type dopant concentrations are set to be low to an extent that an internal electric field strength exists.

In this way, in the semiconductor light receiving element of the fifth embodiment, because the electrons 9 and the positive holes 10 are accelerated in the first light absorbing layer 11d and the second light absorbing layer 13d by setting the p-type dopant concentrations in the respective light absorbing layers 11d, 13d to be low, an even higher speed response is possible.

However, in this case, if the values of the p-type dopant concentrations in the respective light absorbing layers 11d, 13d are set to be too low, the electric field strength for making the positive holes 10 move becomes large.

As a result, the necessary bias application voltage also becomes that much greater.

In accordance therewith, there is concern that destruction of the semiconductor light receiving element will arise due to Joule heat as described above.

Accordingly, the p-type dopant concentrations in the respective light absorbing layers 11d, 13d must be set within a range in which this can be avoided.

The present invention is not limited to the respective embodiments described above.

In the semiconductor light receiving elements of the respective embodiments, the number of light absorbing layers is two layers. However, the present invention has the feature that the spacer layer for acceleration is provided between the plurality of light absorbing layers.

Accordingly, as long as this condition is satisfied, it goes without saying that there may be three or more light absorbing layers.

In the respective embodiments, the semiconductor materials of the spacer layers 12 are not limited to the same semiconductor materials as the respective light absorbing layers 11, 13, and it is possible to use other semiconductor materials including InP, InAlAs, InGaAsP, InGaAlAs, and the like.

In addition, a multi-quantum well structure in which semiconductor materials are combined may be used as the semiconductor material of the spacer layer 12.

Meanwhile, the generated amount of noise of the semiconductor light receiving element can be reduced by setting the band-gap energy e of the spacer layer 12 to be large.

As described above, the spacer layer 12 is not limited to an i-type (non-doped type) semiconductor such as i-InGaAs or the like, and may be a layer formed from a semiconductor material which can make the electrons and the positive holes accelerate and run in the interior thereof.

For example, the above-described spacer layer 12 may be a layer formed from a semiconductor material doped to n-type, or may be a layer formed from a semiconductor material weakly doped to p-type to the extent that an internal electric field exists.

Further, the spacer layer itself may be made to function as a light absorbing layer absorbing light.

Moreover, when a notch can be formed in the band at the junction between the light absorbing layer and the spacer layer, if doping by p-type dopant having a high concentration is carried out at the light absorbing layer side and the dopant is inserted into the junction, the notch of the band can be made small.

In the respective embodiments, it was assumed that the wavelength of the incident light is 1.55 μm, but the wavelength may be another wavelength such as 1.3 μm or the like.

Further, the semiconductor materials of the light absorbing layers may be, instead of p-InGaAs, and instead of a four-source mixed crystal such as p-InGaAsP, p-InGaAlAs, or the like, a multi-quantum well doped to p-type.

In addition, the semiconductor material of the contact layer 5 can use, instead of p$^+$-InGaAs, various types of semiconductor materials such as p$^+$-InGaAsP or the like.

As described above, in accordance with the semiconductor light receiving element of the present invention, the light absorbing layer is formed from plural layers, and the spacer layer for acceleration is provided between the plural light absorbing layers.

Namely, the semiconductor light receiving element of the present invention is used in which the spacer layer for acceleration having a drifting effect is sandwiched between the plurality of light absorbing layers which are doped to p-type.

Therefore, in accordance with the present invention, as compared with the case in which the conventional light absorbing layer is one layer and is thick, the diffusion state of the electrons determining the response speed of the semiconductor light receiving element is greatly improved. As a result, a high-speed response as a semiconductor light receiving element is possible.

Moreover, in the semiconductor light receiving element in accordance with the present invention, because the thickness of each light absorbing layer doped to p-type is thin and is about ½ compared with the prior art, even if the incident light amount of light is small, the electrons can respond sufficiently quickly in each light absorbing layer.

That is, in this case, also when the electrons must move purely by only diffusion because the number of electrons generated in the light absorbing layer is small and the repulsion thereamong cannot be expected, the thickness of each of the doped light absorbing layers is thin, and thereby the electrons can respond sufficiently quickly.

On the other hand, with regard to the incident light, because the thickness of the light absorbing layer is the total thickness of the respective thicknesses of the plurality of light absorbing layers, the efficiency of the incident light being converted into the electrons and the positive holes can be markedly increased.

Accordingly, compared with the conventional UTC-PD, in the semiconductor light receiving element of the present invention, a rapid frequency response characteristic can be realized even when the incident light amount of light is small.

In accordance therewith, in the semiconductor light receiving element of the present invention, there is no need to use a fiber amplifier before light is led to the light receiving element, and it is advantageous also from the standpoint of the cost of a communication system.

As described above in detail, according to the present invention, it is possible to provide a semiconductor light receiving element in which, by interposing a spacer layer for acceleration between a plurality of light absorbing layers, high-speed movement of electrons at the light absorbing layers is possible, and which can use a light absorbing layer which is thick on the whole, and which is high-speed and highly efficient regardless of the magnitude of the incident light amount, and to provide a method of manufacturing the same.

What is claimed is:

1. A semiconductor light receiving element comprising:

an n electrode;

an n-type semiconductor doped layer or a non-doped layer provided above the n electrode;

a semiconductor light absorbing layer provided above the n-type semiconductor doped layer or the non-doped layer;

a p-type semiconductor doped layer provided above the semiconductor light absorbing layer; and a p electrode provided above the p-type semiconductor doped layer, wherein the semiconductor light absorbing layer has at least two layer portions doped to p-type, and a spacer layer for acceleration which is formed from a semiconductor material sandwiched by the two layer portions and which makes electrons and positive holes generated by incident light being absorbed at the semiconductor light absorbing layer accelerate and run.

2. A semiconductor light receiving element according to claim 1, wherein the spacer layer is formed from a non-doped type semiconductor material.

3. A semiconductor light receiving element according to claim 1, wherein the spacer layer is formed from a semiconductor material doped to n-type.

4. A semiconductor light receiving element according to claim 1, wherein the spacer layer is formed from a semiconductor material weakly doped to p-type to an extent that an internal electric field exists.

5. A semiconductor light receiving element according to claim 4, wherein the semiconductor light absorbing layer is set such that a dopant concentration of at least one of the two layer portions doped to p-type and a dopant concentration of the spacer layer formed from a semiconductor material weakly doped to p-type to an extent that the internal electric field exists become lower from the p electrode side toward the n electrode side.

6. A semiconductor light receiving element according to claim 1, wherein the spacer layer is formed from a multi-quantum well structure in which a plurality of semiconductor materials are combined.

7. A semiconductor light receiving element according to claim 1, wherein the semiconductor light absorbing layer is set such that band-gap wavelengths of the respective two layer portions doped to p-type become longer from the p electrode side toward the n electrode side.

8. A semiconductor light receiving element according to claim 1, wherein the semiconductor light absorbing layer is set such that a band-gap wavelength of at least one of the two layer portions doped to p-type becomes longer in an inclined manner from the p electrode side toward the n electrode side.

9. A semiconductor light receiving element according to claim 1, wherein the semiconductor light absorbing layer is set such that a dopant concentration of at least one of the two layer portions doped to p-type becomes lower from the p electrode side toward the n electrode side.

10. A semiconductor light receiving element according to claim 1, wherein the semiconductor light absorbing layer is weakly doped such that a dopant concentration of at least one of the two layer portions doped to p-type makes an internal electric field exist.

* * * * *